US011705355B2

(12) United States Patent
Amikura et al.

(10) Patent No.: US 11,705,355 B2
(45) Date of Patent: Jul. 18, 2023

(54) SUBSTRATE TRANSFER SYSTEM AND ATMOSPHERIC TRANSFER MODULE

(71) Applicant: TOKYO ELECTRON LIMITED, Tokyo (JP)

(72) Inventors: Norihiko Amikura, Miyagi (JP); Toshiaki Toyomaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/542,249

(22) Filed: Dec. 3, 2021

(65) Prior Publication Data
US 2022/0093438 A1 Mar. 24, 2022

Related U.S. Application Data

(63) Continuation of application No. 17/187,299, filed on Feb. 26, 2021, now Pat. No. 11,227,785.

(30) Foreign Application Priority Data

Mar. 3, 2020 (JP) .................................. 2020-035931

(51) Int. Cl.
*H01L 21/677* (2006.01)
*H01L 21/67* (2006.01)
*H01L 21/68* (2006.01)
*B65G 47/90* (2006.01)
*H01L 21/687* (2006.01)

(52) U.S. Cl.
CPC ........ *H01L 21/67766* (2013.01); *B65G 47/90* (2013.01); *H01L 21/67017* (2013.01); *H01L 21/67184* (2013.01); *H01L 21/67196* (2013.01); *H01L 21/681* (2013.01); *H01L 21/68707* (2013.01); *H01L 21/67126* (2013.01)

(58) Field of Classification Search
CPC ......... H01L 21/67766; H01L 21/67017; H01L 21/681; H01L 21/68; H01L 21/68707; B65G 47/90
See application file for complete search history.

(56) References Cited

U.S. PATENT DOCUMENTS

| 7,527,497 | B2 | 5/2009 | Matsuoka |
| 7,780,438 | B2 | 8/2010 | Hayashi et al. |
| 7,949,425 | B2 * | 5/2011 | Mitchell ........... H01L 21/67745 700/218 |
| 10,522,381 | B2 * | 12/2019 | Ahamed ........... H01L 21/68707 |

(Continued)

FOREIGN PATENT DOCUMENTS

JP 2015-18875 A 1/2015

*Primary Examiner* — Gerald McClain
(74) *Attorney, Agent, or Firm* — Weihrouch IP

(57) ABSTRACT

A substrate transfer system includes a load lock module, an atmospheric transfer module having a first sidewall adjacent to the load lock module and a second sidewall remote from the load lock module, the atmospheric transfer module being connected to the load lock module, and a substrate transfer robot disposed in the atmospheric transfer module. The substrate transfer robot includes a base configured to reciprocate along the first sidewall, a substrate transfer arm disposed on the base, and a flow rectifier surrounding the base, the flow rectifier being configured, upon movement of the base, to create an obliquely downward air flow in a direction opposite to a moving direction of the base.

9 Claims, 14 Drawing Sheets

(56) References Cited

U.S. PATENT DOCUMENTS

| | | | | |
|---|---|---|---|---|
| 11,501,987 B2* | 11/2022 | Kim | ............... | H01L 21/67167 |
| 2004/0191028 A1* | 9/2004 | Tamai | ............... | H01L 21/67748 |
| | | | | 414/217 |
| 2005/0045821 A1* | 3/2005 | Noji | ............... | H01L 21/6833 |
| | | | | 250/311 |
| 2007/0218706 A1* | 9/2007 | Matsuoka | ............ | H01L 21/6719 |
| | | | | 118/724 |
| 2008/0138178 A1* | 6/2008 | Ferrara | ............... | C23C 14/48 |
| | | | | 414/757 |
| 2019/0348264 A1* | 11/2019 | Tsai | ............... | C23C 14/021 |
| 2020/0013657 A1* | 1/2020 | Lee | ............... | H01L 21/6833 |
| 2021/0050240 A1* | 2/2021 | Moyama | ............ | H01L 21/67201 |
| 2021/0057256 A1* | 2/2021 | Bergantz | ............ | H01L 21/67748 |
| 2021/0172728 A1* | 6/2021 | Waqar | ............... | H01L 21/67253 |
| 2021/0272783 A1* | 9/2021 | Toyomaki | ............ | H01J 37/32733 |
| 2021/0291375 A1* | 9/2021 | Bergantz | ............ | H01L 21/68 |
| 2021/0398838 A1* | 12/2021 | Amikura | ............ | H01L 21/67259 |
| 2022/0246408 A1* | 8/2022 | Genetti | ............ | H01L 21/67346 |
| 2022/0254666 A1* | 8/2022 | Sadeghi | ............ | H01L 21/67259 |

* cited by examiner

SUBSTRATE TRANSFER SYSTEM AND ATMOSPHERIC TRANSFER MODULE

CROSS-REFERENCE TO RELATED APPLICATIONS

This application is a continuation application of U.S. application Ser. No. 17/187,299, filed Feb. 26, 2021, which claims priority to Japanese Patent Application No. 2020-035931, filed on Mar. 3, 2020, the entire contents of which are incorporated herein by reference and priority is claimed to each.

TECHNICAL FIELD

Various aspects and embodiments of the present disclosure relate to a substrate transfer system and an atmospheric transfer module.

BACKGROUND

There is known a semiconductor manufacturing apparatus that includes a load lock chamber, a transfer chamber connected to the load lock chamber and configured to transfer a substrate in an atmospheric atmosphere, and a transfer device provided in the transfer chamber (see, for example, Japanese Patent Application Publication No. 2015-18875). The transfer device is configured to move along a longitudinal direction of the transfer chamber and transfer the substrate between the load lock chamber and the transfer chamber.

SUMMARY

The present disclosure provides a substrate transfer system and an atmospheric transfer module that can reduce an installation area of a substrate processing system.

In accordance with an aspect of the present disclosure, there is provided a substrate transfer system including: a load lock module; an atmospheric transfer module having a first sidewall adjacent to the load lock module and a second sidewall remote from the load lock module, the atmospheric transfer module being connected to the load lock module; and a substrate transfer robot disposed in the atmospheric transfer module, the substrate transfer robot including: a base configured to reciprocate along the first sidewall; a substrate transfer arm disposed on the base; and a flow rectifier surrounding the base, the flow rectifier being configured, upon movement of the base, to create an obliquely downward air flow in a direction opposite to a moving direction of the base.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a substrate transfer system and an atmospheric transfer module will be described in detail with reference to the accompanying drawings. In addition, the substrate transfer system and the atmospheric transfer module to be described are not limited by the following embodiments.

In order to increase the number of substrates that can be processed per unit time, it may be an option to increase the number of processing modules that process the substrates. However, as the number of processing modules increases, a substrate processing system, which includes a plurality of processing modules, a vacuum transfer module, a load lock module, an atmospheric transfer module, and the like, becomes larger in size. When the size of the substrate processing system is increased, the installation area (footprint) of the substrate processing system in a facility such as a clean room is increased, which makes it difficult to arrange a plurality of substrate processing systems. For that reason, there is a demand for reducing the installation area of the substrate processing system.

Accordingly, the present disclosure provides a technique for reducing the installation area of the substrate processing system.

First Embodiment (Configuration of the Substrate Processing System 1)

Figure 1:
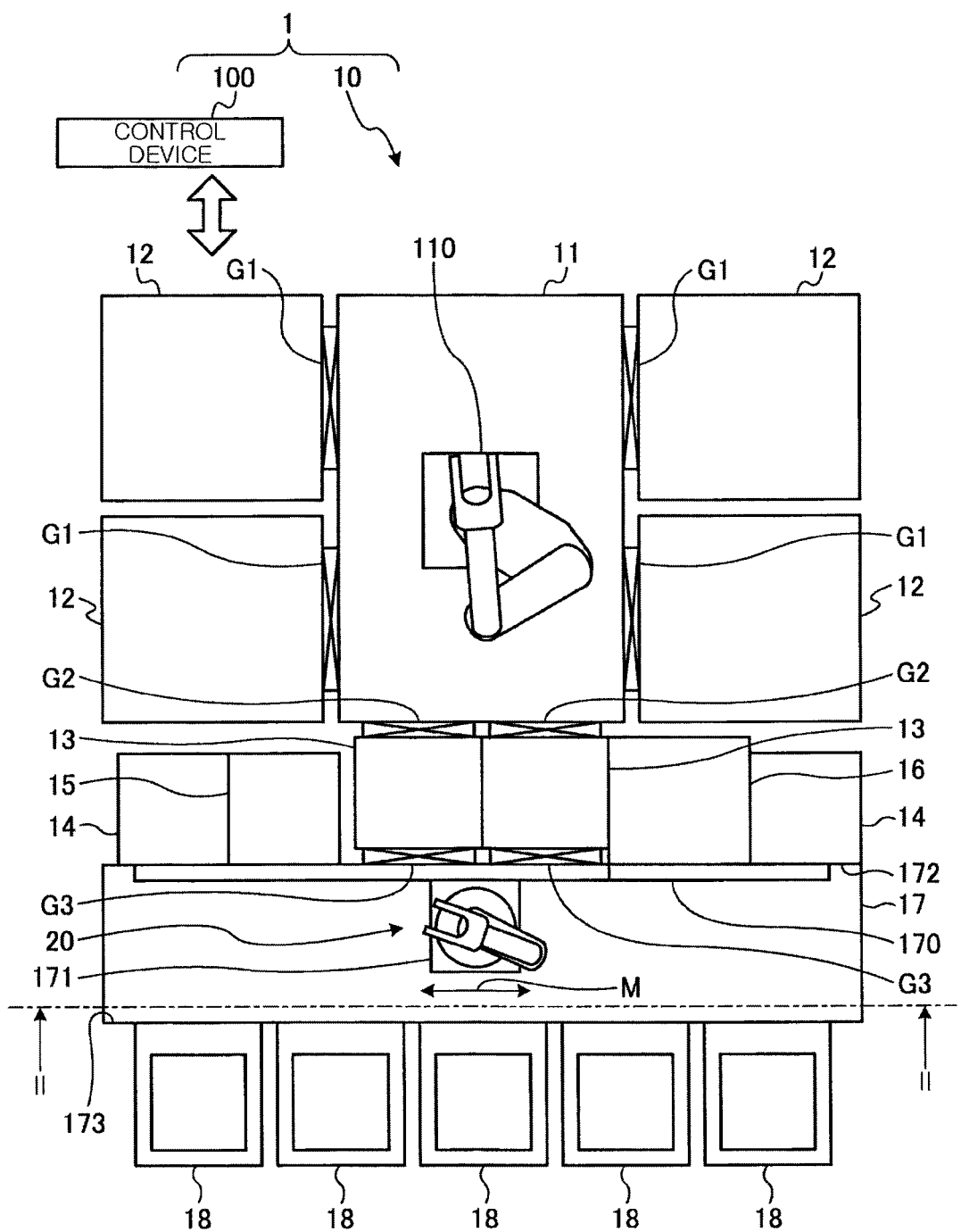
FIG. 1 is a plan view showing an example of a substrate processing system according to a first embodiment.
Figure 2:
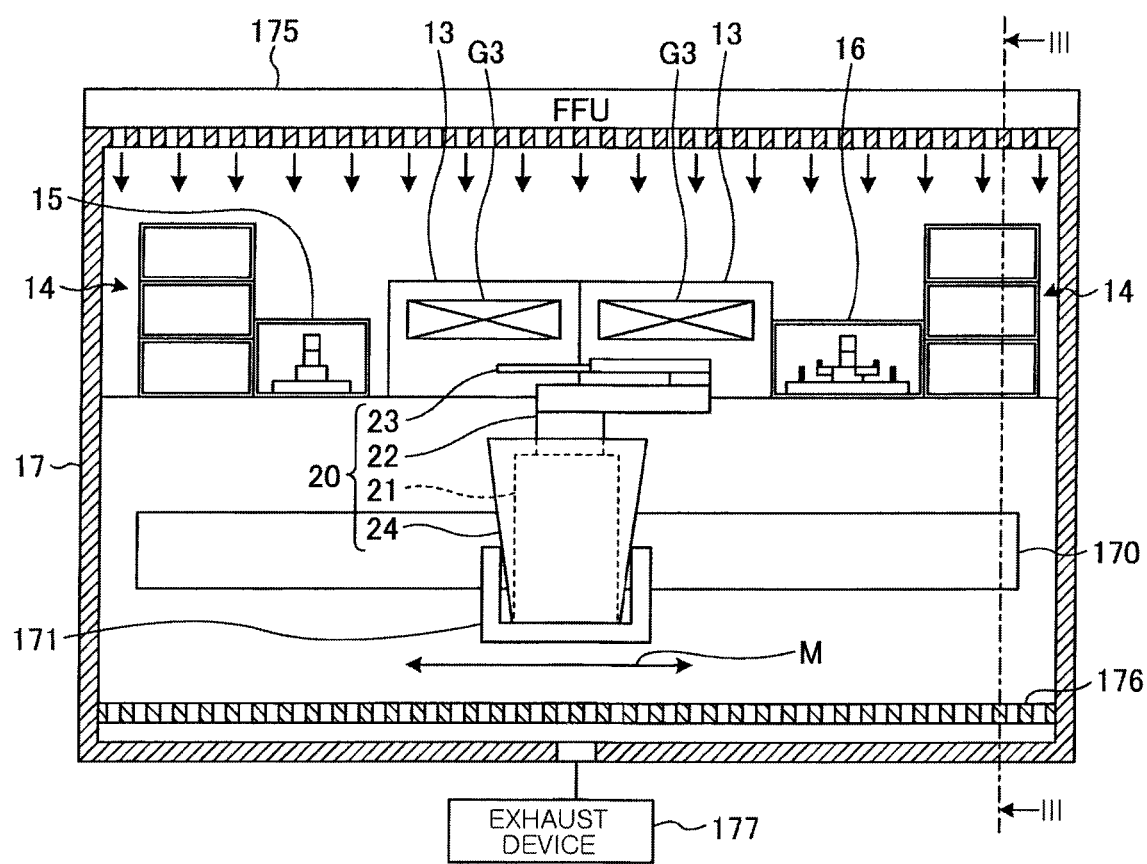
FIG. 2 shows an example of a cross-sectional view of the substrate processing system taken along a dashed dotted line II-II in FIG. 1.
Figure 3:
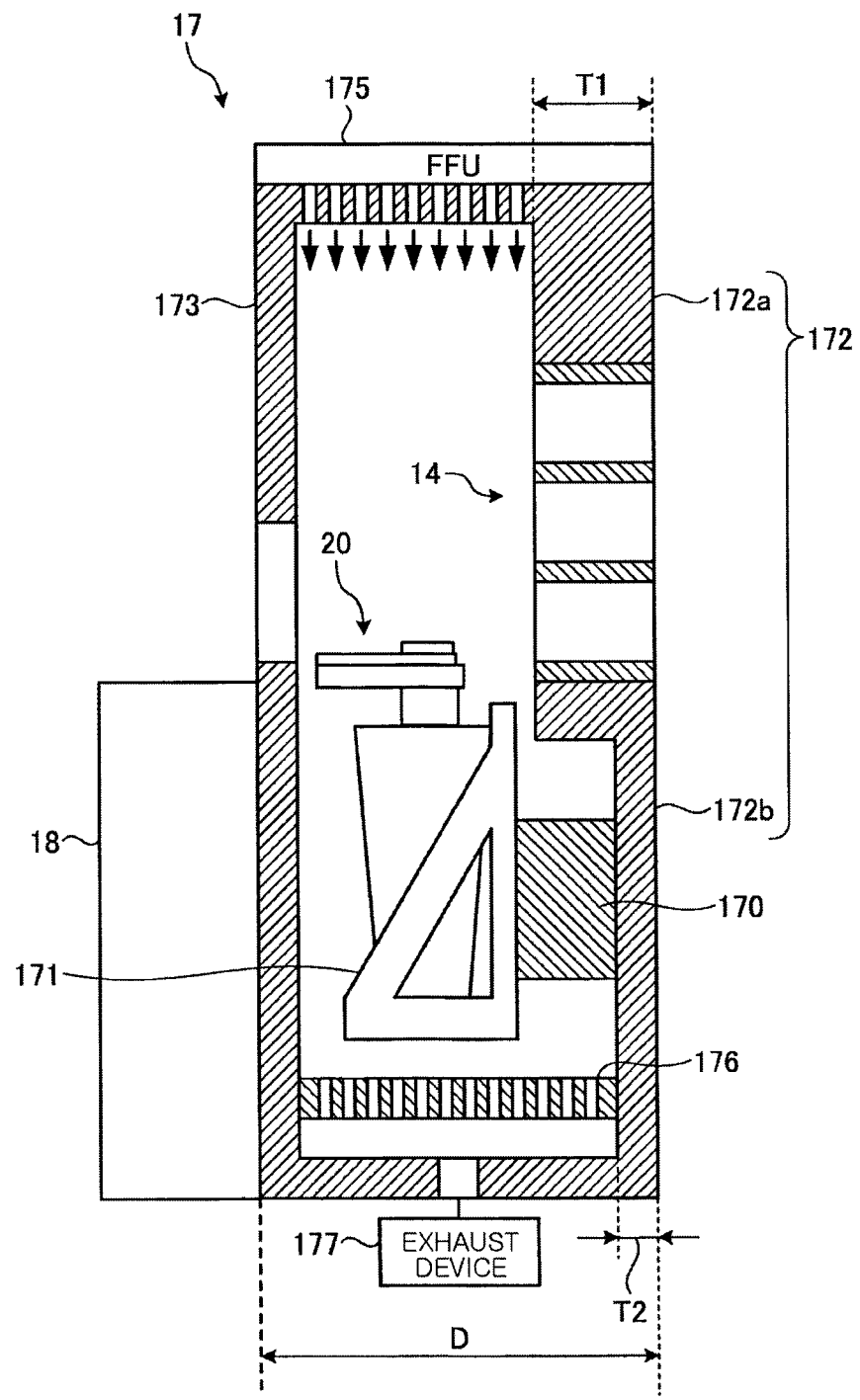
FIG. 3 shows an example of a cross-sectional view of an atmospheric transfer module taken along a dashed dotted line III-III in FIG. 2.

FIG. 1 is a plan view showing an example of the configuration of a substrate processing system 1 according to a first embodiment. FIG. 2 shows an example of a cross-sectional view of the substrate processing system 1 taken along a dashed dotted line II-II in FIG. 1. FIG. 3 shows an example of a cross-sectional view of the atmospheric transfer module 17 taken along a dashed dotted line III-III in FIG. 2. In FIG. 1, for the sake of convenience, the internal components of some devices are shown as being visible. The substrate processing system 1 includes a main body 10 and a control device 100 that controls the main body 10.

The main body 10 includes a vacuum transfer module 11, a plurality of substrate processing modules 12, a plurality of load lock modules 13, a plurality of storage modules 14, and a substrate aligner module 15. Further, the main body 10 includes an edge ring (ER) aligner module 16, an atmospheric transfer module 17, and a plurality of load ports 18. The plurality of substrate processing modules 12 are connected to the vacuum transfer module 11 via the corresponding gate valves G1. The gate valves G1 are installed on sidewalls of the vacuum transfer module 11. The plurality of storage modules 14, the substrate aligner module 15, and the ER aligner module 16 are connected to the atmospheric transfer module 17 through the corresponding openings. The openings are formed in a first sidewall 172 of the atmospheric transfer module 17. Further, a Front Opening Unified Pod (FOUP) arranged on each of the plurality of load ports 18 can be connected to the atmospheric transfer module 17 at a second sidewall 173 of the atmospheric transfer module 17. The plurality of load lock modules 13 are connected to the vacuum transfer module 11 via the corresponding gate valves G2 and connected to the atmospheric transfer module 17 via the corresponding gate valves G3. The gate valves G2 are installed on a sidewall of the vacuum transfer module 11, and the gate valves G3 are installed on the first sidewall 172 of the atmospheric transfer module 17. That is, the plurality of load lock modules 13 are fixed to the atmospheric transfer module 17 via the corresponding gate valves G3.

The gate valves G1 are installed on the sidewalls of the vacuum transfer module 11, and each gate valve G1 is also installed on the substrate processing module 12. In the example of FIG. 1, four substrate processing modules 12 are connected to the vacuum transfer module 11. However, the number of substrate processing modules 12 connected to the vacuum transfer module 11 may be three or less, or may be five or more.

Each substrate processing module 12 is configured to perform processing such as etching or film formation on the substrate W. In the present embodiment, the substrate processing module 12 is a plasma processing module, and the plasma processing module is configured to perform a plasma processing such as etching and film formation on the substrate W in a vacuum atmosphere. In addition, "vacuum" in the present specification may refer to a pressure lower than atmospheric pressure and may be described as "reduced pressure" or "low pressure." The substrate processing modules may be modules that perform the same processing or different types of processing in a manufacturing process. Each substrate processing module 12 includes a stage on which the substrate W is placed, and the stage includes an edge ring (hereinafter, may be referred to as ER) so as to surround the substrate W. Since the ER is consumed by the plasma processing, e.g., etching, of the substrate W, the ER is replaced at a predetermined timing.

Further, the plurality of load lock modules 13 are connected to the sidewall of the vacuum transfer module 11 via the gate valves G2. In the example of FIG. 1, two load lock modules 13 are connected to the vacuum transfer module 11. However, the number of load lock modules 13 connected to the vacuum transfer module 11 may be one, or may be three or more.

A transfer robot 110 is provided in the vacuum transfer module 11. The transfer robot 110 serves as a substrate transfer robot configured to transfer the substrate W between the substrate processing module 12 and the load lock module 13. The transfer robot 110 also serves as an ER transfer robot configured to transfer the ER between the substrate processing module 12 and the load lock module 13. Therefore, the transfer robot 110 serving as the substrate transfer robot can further transfer the edge ring. The inside of the vacuum transfer module 11 is maintained at a predetermined pressure (hereinafter, may be referred to as "low pressure") lower than the atmospheric pressure. In the present embodiment, the vacuum transfer module 11 is configured to transfer the substrate or the edge ring in the vacuum atmosphere. In the present embodiment, the substrate or the edge ring is transferred between the vacuum transfer module 11 and the substrate processing module 12 by the transfer robot 110 via the corresponding gate valve G1 in the vacuum atmosphere. In the present embodiment, the substrate or the edge ring is transferred between the vacuum transfer module 11 and the load lock module 13 by the transfer robot 110 via the corresponding gate valve G2 in the vacuum atmosphere.

Each load lock module 13 is connected to the atmospheric transfer module 17 via the corresponding gate valve G3. When the substrate W or the ER is transferred from the atmospheric transfer module 17 into the load lock module 13 via the gate valve G3, the gate valve G3 is closed and the pressure in the load lock module 13 is reduced from the atmospheric pressure to the low pressure. Then, the gate valve G2 is opened, and the substrate W or the ER in the load lock module 13 is transferred into the vacuum transfer module 11.

Further, when the substrate W or the ER is loaded from the vacuum transfer module 11 into the load lock module 13 via the corresponding gate valve G2 while the pressure in the load lock module 13 is the low pressure, the gate valve G2 is closed. Then, the pressure in the load lock module 13 is increased from the low pressure to the atmospheric pressure. Then, the gate valve G3 is opened, and the substrate W or the ER in the load lock module 13 is transferred into the atmospheric transfer module 17.

The plurality of load ports 18 are fixed to the second sidewall 173 opposite to the first sidewall 172 to which the load lock modules 13 are fixed (that is, the first sidewall 172 is adjacent to the load lock modules). Therefore, the atmospheric transfer module 17 has the first sidewall 172 and the second sidewall 173 opposite to the first sidewall 172 (that is, the second sidewall 173 is remote from the load lock modules), and the load lock modules 13 are fixed to the first sidewall 172, and the load ports 18 are fixed to the second sidewall 173 (that is, the load ports are adjacent to the second sidewall 173). The FOUP accommodating a plurality of substrates W is connected to each load port 18. A FOUP accommodating the ER may be connected to the load port 18.

A transfer robot 20 is provided in the atmospheric transfer module 17. The transfer robot 20 is an example of a substrate transfer robot. The transfer robot 20 serves as a substrate transfer robot configured to transfer the substrate W among the FOUPs arranged on the load ports 18, the load lock modules 13, the storage modules 14, and the substrate aligner module 15. In addition, the transfer robot 20 also serves as an ER transfer robot configured to transfer the ER among the FOUPs arranged on the load ports 18, the load lock modules 13, and the ER aligner module 16. Therefore, the transfer robot 20 serving as the substrate transfer robot can further transfer the edge ring. In the present embodiment, the atmospheric transfer module 17 is configured to transfer the substrate or the edge ring in the atmospheric atmosphere. In the present embodiment, the substrate or the edge ring is transferred between the FOUPs, the load lock modules 13, the storage modules 14, and the substrate aligner module 15 by the transfer robot 20 in the atmospheric atmosphere. A guide rail 170 is fixed to the first sidewall 172 of the atmospheric transfer module 17 to which the load lock module 13 is fixed. In the present embodiment, for example, as shown in FIG. 3, the first sidewall 172 has an upper portion 172a and a lower portion 172b. A thickness T2 of the lower portion 172b is smaller than a thickness T1 of the upper portion 172a. The plurality of load lock modules 13, the plurality of storage modules 14, the substrate aligner module 15, and the ER aligner module 16 are fixed to the upper portion 172a. The guide rail 170 is fixed to the lower portion 172b. The transfer robot 20 is mounted on a carrier 171 and the carrier 171 reciprocates in a moving direction M, which is the direction along the guide rail 170. When the carrier 171 reciprocates in the moving direction M along the guide rail 170, the transfer robot 20 also reciprocates in the moving direction M along the guide rail 170 in the atmospheric transfer module 17.

As described above, in the present embodiment, the guide rail 170 is fixed to the first sidewall 172 to which the load lock module 13 is fixed, and the transfer robot 20 mounted on the carrier 171 reciprocates in the direction along the guide rail 170. With such a configuration, a drive mechanism for moving the carrier 171 can be disposed at a position below the load lock module 13. In the present embodiment, a distance (for example, the depth dimension shown in FIG. 3) D between the first sidewall 172 and the second sidewall 173 is, for example, 700 mm or less. Accordingly, the substrate processing system 1 can be reduced in size. Further, by making the lower portion 172b of the first sidewall 172 thinner than the upper portion 172a of the first sidewall 172, it is possible to suppress the protrusion of the guide rail 170 into the atmospheric transfer module 17. Therefore, the depth dimension D of the atmospheric transfer module 17 can be further reduced. In other words, it is possible to maintain a sufficient transfer space in the atmospheric transfer module 17 without increasing the depth dimension D of the atmospheric transfer module 17.

Further, in the present embodiment, the transfer robot 20 is movable at a rate of 800 mm/sec or more along the guide rail 170 in the atmospheric transfer module 17. Therefore, the time period required for transferring the substrate W and the ER can be reduced, and the number of substrates W that can be processed per unit time can be increased.

The substrate aligner module 15 is disposed between one load lock module 13 and one storage module 14. Further, the ER aligner module 16 is disposed between the other load lock module 13 and the other storage module 14. In the present embodiment, the storage module 14 and the substrate aligner module 15 are disposed adjacent to (on the lateral side of) one load lock module 13 between the substrate processing module 12 and the atmospheric transfer module 17, and the storage module 14 and the ER aligner module 16 are disposed adjacent to (on the lateral side of) the other load lock module 13 and between the substrate processing module 12 and the atmospheric transfer module 17. Therefore, the installation area of the substrate processing system 1 can be reduced.

Each storage module 14 temporarily puts an unprocessed substrate W and a processed substrate W on standby. The substrate aligner module 15 adjusts the orientation of the substrate W transferred into the substrate aligner module 15. The orientation-adjusted substrate W is transferred from the substrate aligner module 15 in the atmospheric transfer module 17 by the transfer robot 20, and is transferred from the atmospheric transfer module 17 into the load lock module 13 through the gate valve G3. The ER aligner module 16 adjusts the orientation of the transferred ER in the ER aligner module 16. The orientation-adjusted ER is transferred from the ER aligner module 16 into the atmospheric transfer module 17 by the transfer robot 20, and is transferred from the atmospheric transfer module 17 into the load lock module 13 through the gate valve G3.

An fan filter unit (FFU) 175 is installed on an upper portion of the atmospheric transfer module 17. The FFU 175 supplies air, from which particles and the like are removed (hereinafter referred to as "clean air"), into the atmospheric transfer module 17 from the upper portion of the atmospheric transfer module 17.

A perforated floor 176 is provided at a bottom portion of the atmospheric transfer module 17, and an exhaust device 177 for exhausting clean air in the atmospheric transfer module 17 is connected to the bottom of the atmospheric transfer module 17 below the perforated floor 176. The clean air supplied from the FFU 175 is exhausted by the exhaust device 177 through the perforated floor 176, so that a downflow of the clean air is formed in the atmospheric transfer module 17. As a result, it is possible to suppress particles and the like from swirling upward in the atmospheric transfer module 17. In addition, the exhaust device 177 may control a pressure inside the atmospheric transfer module 17 such that the interior of the atmospheric transfer module 17 has a positive pressure. As a result, it is possible to suppress external particles and the like from entering the atmospheric transfer module 17.

As shown in FIG. 2, for example, the transfer robot 20 has a base 21, a transfer arm 22, an end effector 23, and a cover 24. The base 21 has a vertically extending shape and accommodates a drive mechanism such as a motor that drives the transfer arm 22. The base 21 is mounted on the carrier 171 and moves along the guide rail 170 together with the movement of the carrier 171. The transfer arm 22 moves the end effector 23 provided at the tip end thereof. The transfer arm 22 is an example of a substrate transfer arm. That is, the substrate transfer arm is configured to transfer the substrate W. In the present embodiment, the transfer arm 22 serving as the substrate transfer arm can further transfer the edge ring. The end effector 23 holds the substrate W and the ER. The cover 24 surrounds the base 21. When the base 21 moves along the guide rail 170, the cover 24 creates an obliquely downward air flow in a direction opposite to a moving direction of the base 21. The cover 24 is an example of a flow rectifier. In the present embodiment, the cover 24 serving as the flow rectifier and the base 21 have been described as separate members that can be separated from each other. However, the present disclosure is not limited thereto. For example, the flow rectifier and the base 21 may be formed as one unit.

The control device 100 includes a memory, a processor, and an input/output interface. The memory stores data such as recipes, and programs. For example, the memory may include a random access memory (RAM), a read only memory (ROM), a hard disk drive (HDD), a solid state drive (SSD), or the like. The processor executes a program read from the memory to control each unit of the main body 10 through the input/output interface based on the data such as the recipe stored in the memory. The processor may be a central processing unit (CPU) or a digital signal processor (DSP).

(Detailed Configuration of the Cover 24)

Figure 4:
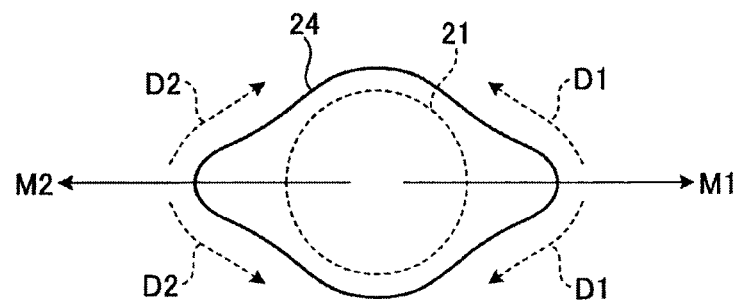
FIG. 4 is a plan view showing an example of an outer shape of a cover of a transfer robot.

FIG. 4 is a plan view showing an example of the outer shape of the cover 24 of the transfer robot 20. FIG. 4 shows an example of the outer shape of the cover 24 when viewed from the top. In the present embodiment, the cover 24 has an inclined side face to be described later. The inclined side face has a first portion and a second portion. The first portion is formed on a moving direction M1 side of the cover 24, and the second portion is formed on a moving direction M2 side of the cover 24. The first portion has an outer shape tapering toward the moving direction M1 when viewed from the top (in a plan view). In the present embodiment, the first portion has a streamlined outer shape tapering toward the moving direction M1 in a plan view. With such a configuration, when the transfer robot 20 moves in the moving direction M1 along the guide rail 170, an air flow is created in an oblique direction D1 with respect to a direction opposite to the moving direction M1.

Further, in the present embodiment, the second portion has an outer shape tapering toward the moving direction M2 when viewed from the top (in a plan view). In the present embodiment, the second portion has a streamlined outer shape tapering toward the moving direction M2 in a plan view. With such a configuration, when the transfer robot 20 moves in the moving direction M2 along the guide rail 170, an air flow is created in an oblique direction D2 with respect to a direction opposite to the moving direction M2.

Accordingly, even when a distance between the first sidewall 172 of the atmospheric transfer module 17 adjacent the load lock module 13 and the second sidewall 173 of the atmospheric transfer module 17 opposite to the first sidewall 172 is shortened, the air turbulence generated by the movement of the transfer robot 20 can be suppressed. Consequently, it is possible to prevent particles swirling upward in the atmospheric transfer module 17 due to the movement of the transfer robot 20 from adhering to the substrate W and the ER held by the end effector 23.

Figure 5:
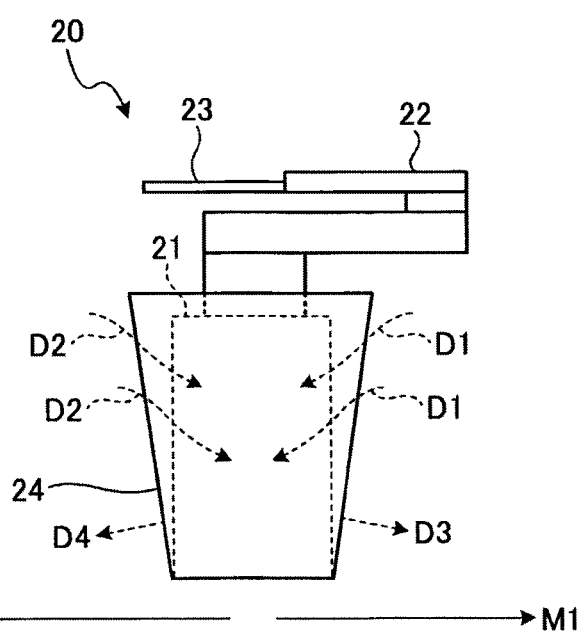
FIG. 5 is a side view showing an example of the transfer robot.

FIG. 5 is a side view showing an example of the transfer robot 20. For example, as shown in FIG. 5, in the present embodiment, the cover 24 has an outer shape in which the cross-sectional area increases from the bottom to the top. Further, in the present embodiment, the front side of the cover 24 in the moving direction has an inclined face having a straight line obliquely downward with respect to the moving direction as a normal line. In the present embodiment, the cover 24 has an inclined side face, a bottom, and a top, and the inclined side face flares from the bottom to the top in a plan view (top view). As a result, an obliquely downward air flow is created.

In the example of FIG. 5, on the front side of the cover 24 in the moving direction M1, an inclined face having a normal line along a direction D3 obliquely downward with respect to the moving direction M1 is formed. Further, on the front side of the cover 24 in the moving direction M2, an inclined face having a normal line along a direction D4 obliquely downward with respect to the moving direction M2 is formed. In the present embodiment, the cover 24 has, for example, a truncated cone-like outer shape. In another embodiment, the cover 24 may have, for example, a pyramid-like outer shape.

As a result, for example, as shown in FIG. 5, when the transfer robot 20 moves in the moving direction M1, an air flow is created along the cover 24 in the obliquely downward direction D1 with respect to the direction opposite to the moving direction M1. Further, for example, as shown in FIG. 5, when the transfer robot 20 moves in the moving direction M2, an air flow is created along the cover 24 in the obliquely downward direction D2 with respect to the direction opposite to the moving direction M2. Consequently, it is possible to prevent particles swirling upward in the atmospheric transfer module 17 due to the movement of the transfer robot 20 from adhering to the substrate W and the ER held by the end effector 23.

Figure 6:
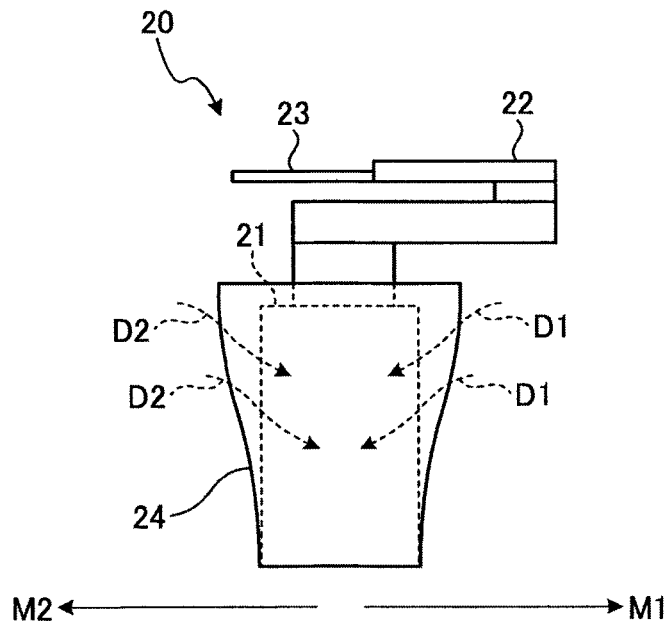
FIG. 6 is a side view showing another example of the transfer robot.

If the cover 24 has the outer shape tapering toward the moving direction when viewed from the top and the cross-sectional area increases from the bottom to the top, the outer shape of the cover 24 is, for example, may be streamlined as shown in FIG. 6. In this case, the first portion and the second portion of the inclined side face have a streamlined protrusion (streamline nose). FIG. 6 is a side view showing another example of the transfer robot 20.

Figure 7:
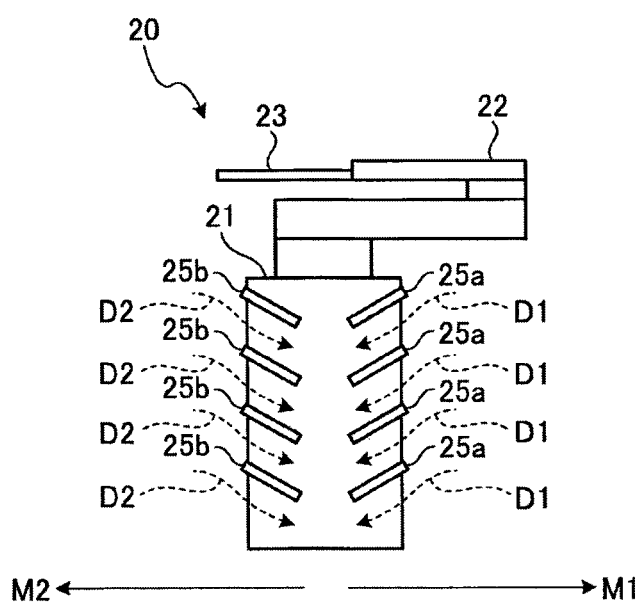
FIG. 7 is a side view showing an example of a transfer robot in which a plurality of blades are provided on a base.

Further, for example, as shown in FIG. 7, a plurality of blades 25a and 25b may be provided on the base 21 instead of the cover 24. FIG. 7 is a side view showing an example of the transfer robot 20 in which a plurality of blades 25 are provided on the base 21.

The plurality of blades 25a are provided on an outer wall of the base 21 so as to extend along a direction obliquely downward with respect to the direction opposite to the moving direction M1. In the example shown in FIG. 7, the plurality of blades 25a are provided on the front side of the base 21 and also provided on the back side of the base 21. As a result, when the transfer robot 20 moves in the moving direction M1, an air flow is created along each blade 25a in the direction D1 that is obliquely downward with respect to the direction opposite to the moving direction M1. Further, the front blade 25a and the back blade 25a at the same height may be connected or arranged apart from each other. That is, the first portion of the inclined side face may have a plurality of chevron-shaped blades 25a vertically arranged and extending along obliquely downward directions. Further, the first portion of the inclined side face may have a plurality of pairs of vertically arranged left and right blades 25a extending along obliquely downward directions.

Further, the plurality of blades 25b are provided on the outer wall of the base 21 so as to extend along a direction obliquely downward with respect to the direction opposite to the moving direction M2. In the example shown in FIG. 7, the plurality of blades 25b are provided on the front side of the base 21 and also provided on the back side of the base 21. As a result, when the transfer robot 20 moves in the moving direction M2, an air flow is created along each blade 25b in the direction D2 that is obliquely downward with respect to the direction opposite to the moving direction M2. Further, the front blade 25b and the back blade 25b at the same height may be connected or arranged apart from each other. That is, the first portion of the inclined side face may have a plurality of chevron-shaped blades 25b vertically arranged and extending along obliquely downward directions. Further, the first portion of the inclined side face may have a plurality of pairs of vertically arranged left and right blades 25b extending along obliquely downward directions. Even with such a configuration, it is possible to prevent particles swirling upward in the atmospheric transfer module 17 due to the movement of the transfer robot 20 from adhering to the substrate W and the ER held by the end effector 23. Alternatively, the outer wall of the cover 24 illustrated in FIG. 5 or 6 may include the plurality of blades 25a and 25b illustrated in FIG. 7.

(Structure of the End Effector 23)

Figure 8:
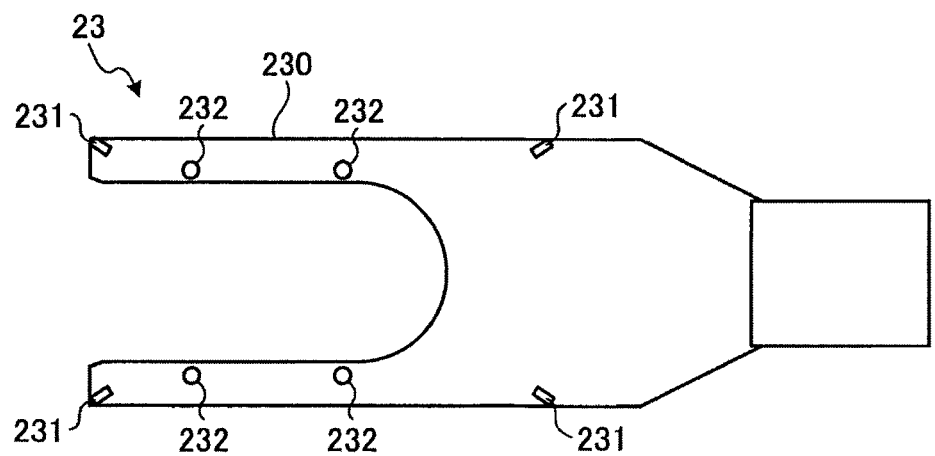
FIG. 8 shows an example of an end effector.

FIG. 8 shows an example of the end effector 23. The end effector 23 has a main body 230, a plurality of ER holding pads 231 and a plurality of substrate holding pads 232. The ER holding pad 231 is an example of the ER holding portion, and the substrate holding pad 232 is an example of the substrate holding portion.

Figure 9:
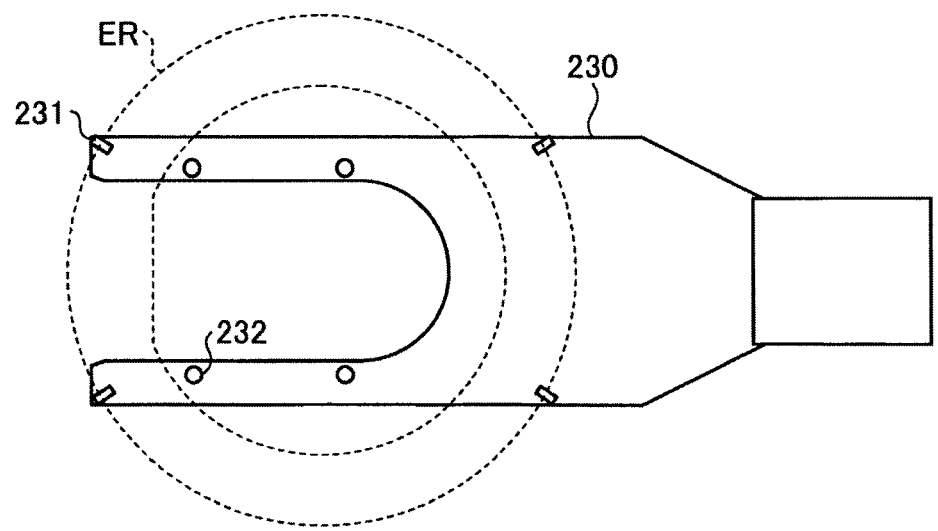
FIG. 9 shows an example of the end effector when transferring an edge ring (ER)
Figure 10:
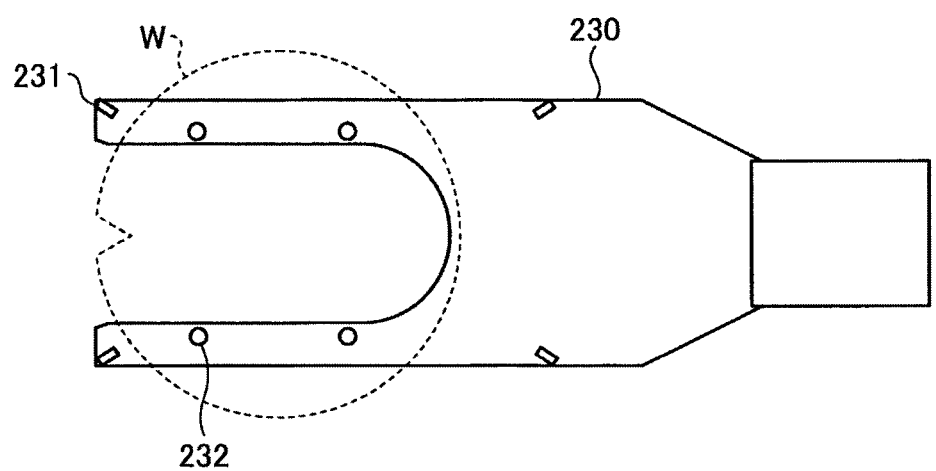
FIG. 10 shows an example of the end effector when transferring a substrate.

For example, as shown in FIG. 9, the plurality of ER holding pads 231 is configured to hold the ER. For example, as shown in FIG. 10, the plurality of substrate holding pads 232 is configured to hold the substrate W, for example, as shown in FIG. Further, the main body 230 may include a suction mechanism for the ER that sucks and holds the ER and a suction mechanism for the substrate W that sucks and holds the substrate W. As a result, even when the end effector 23 moves at high speed, the substrate W and the ER can be stably held on the end effector 23.

The first embodiment has been described above. As described above, the substrate processing system 1 of the present embodiment includes an atmospheric transfer module 17 having a first sidewall 172 and a second sidewall 173 opposite to the first sidewall 172, the load lock module 13 fixed to the first sidewall 172, the load port 18 fixed to the second sidewall 173, and the transfer robot 20 disposed in the atmospheric transfer module 17. The transfer robot 20 includes a base 21, a transfer arm 22, and a cover 24. The base 21 reciprocates along the first sidewall 172. The transfer arm 22 is installed on the base 21. The cover 24 surrounds the base 21 and creates, upon movement of the base 21, an obliquely downward air flow in a direction opposite to the moving direction of the base 21. Accordingly, even when the distance between the first sidewall 172 and the second sidewall 173 is shortened, the air turbulence generated by the reciprocating movement of the transfer robot 20 can be suppressed. Consequently, the atmospheric transfer module 17 can be reduced in size while suppressing the upward swirling of particles due to the movement of the transfer robot 20. Therefore, the installation area of the substrate processing system 1 including the atmospheric transfer module 17 can be reduced.

Further, in the first embodiment described above, the cover 24 has an inclined side face, a bottom, and a top, and the inclined side face flares from the bottom to the top in a plan view, thereby creating the obliquely downward air flow.

Further, in the first embodiment described above, the inclined side face of the cover 24 includes a first portion and a second portion opposite to the first portion in the moving direction, and each of the first portion and the second portion has an outer shape tapering toward the moving direction in a plan view. Accordingly, when the transfer robot 20 moves in the moving direction, an obliquely downward air flow can be created along the cover 24 in a direction opposite to the moving direction.

Further, in the first embodiment described above, the flow rectifier may be a blade 25 extending obliquely downward in a direction opposite to the moving direction. Even with such a configuration, when the transfer robot 20 moves in the moving direction, an obliquely downward air flow can be created along the cover 24 in a direction opposite to the moving direction.

Further, the substrate processing system 1 according to the first embodiment described above further includes the guide rail 170 disposed in the atmospheric transfer module 17 and fixed to the first sidewall 172. The base 21 reciprocates along the guide rail 170. Accordingly, the drive mechanism for moving the carrier 171 can be disposed below the load lock module 13. As a result, the installation area of the substrate processing system 1 can be reduced.

Further, in the first embodiment described above, the first sidewall 172 has an upper portion and a lower portion, the load lock module 13 is fixed to the upper portion, and the guide rail 170 is fixed to the lower portion. Further, the thickness of the lower portion is smaller than the thickness of the upper portion. Accordingly, it is possible to suppress the protrusion of the guide rail 170 into the atmospheric transfer module 17. Therefore, it is possible to further reduce the depth dimension of the atmospheric transfer module 17. In other words, it is possible to maintain a sufficient transfer space in the atmospheric transfer module 17 without increasing the depth dimension of the atmospheric transfer module 17.

Further, in the first embodiment described above, the distance between the first sidewall 172 and the second sidewall 173 is 700 mm or less. Accordingly, the installation area of the substrate processing system 1 can be reduced.

Further, in the first embodiment described above, the transfer robot 20 is movable at a rate of 800 mm/sec or more. Accordingly, the number of substrates W that can be processed per unit time can be increased.

Further, the substrate processing system 1 according to the first embodiment described above further includes the substrate aligner module 15 fixed to the first sidewall 172, and the substrate aligner module 15 is configured to correct the misalignment of the substrate W. Accordingly, the installation area of the substrate processing system 1 can be reduced.

Further, the substrate processing system 1 according to the first embodiment described above further includes the ER aligner module 16 fixed to the first sidewall 172, and the ER aligner module 16 is configured to correct the misalignment of the ER. The transfer arm 22 can further transfer the ER. Accordingly, the installation area of the substrate processing system 1 that automatically replaces the ER can be reduced.

Further, in the first embodiment described above, the transfer arm 22 has an end effector 23 having an ER holding pad 231 and a substrate holding pad 232. Accordingly, the transfer robot 20 can transfer the substrate W and the ER.

Further, the atmospheric transfer module 17 in the first embodiment described above having the first sidewall 172 and the second sidewall 173 opposite to the first sidewall 172, and includes the transfer robot 20 therein. The transfer robot 20 has the base 21, the transfer arm 22, and the cover 24. The base 21 reciprocates along the first sidewall 172. The transfer arm 22 is installed on the base 21. The cover 24 surrounds the base 21 and creates, upon movement of the base 21, an obliquely downward air flow in a direction opposite to the moving direction of the base 21. Accordingly, even when the distance between the first sidewall 172 and the second sidewall 173 is shortened, the air turbulence generated by the movement of the transfer robot 20 can be suppressed. Consequently, the atmospheric transfer module 17 can be reduced in size while suppressing the upward swirling of particles due to the movement of the transfer robot 20. Therefore, the installation area of the substrate processing system 1 including the atmospheric transfer module 17 can be reduced.

Second Embodiment

In the substrate processing system 1 of the first embodiment, the substrate aligner module 15 and the ER aligner module 16 are separately provided. On the other hand, a substrate processing system 1 in the present embodiment is provided with one aligner module 30 having the functions of the substrate aligner module 15 and the ER aligner module 16. Accordingly, the installation area of the substrate processing system 1 can be further reduced.

(Configuration of the Substrate Processing System 1)

Figure 11:
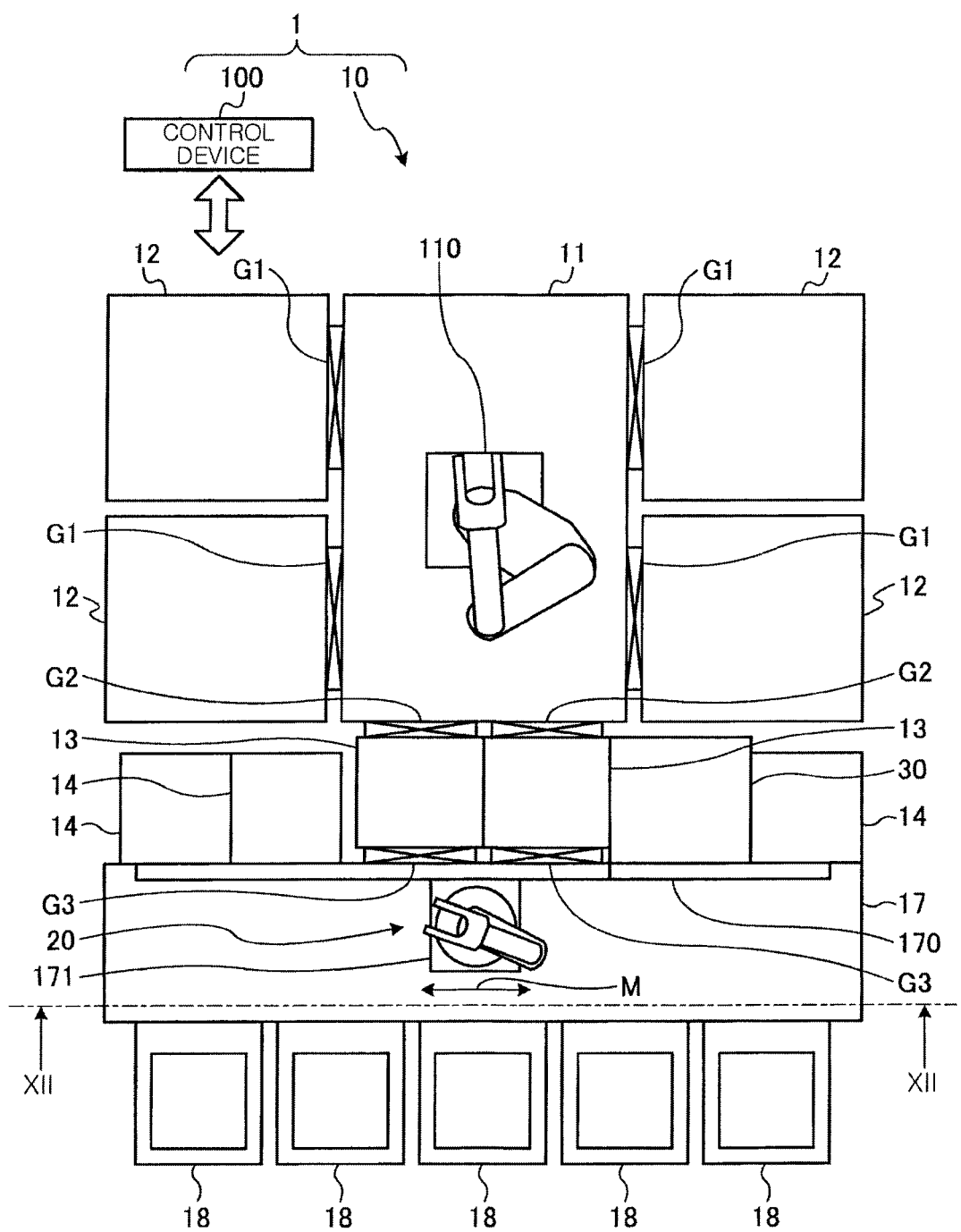
FIG. 11 is a plan view showing an example of a substrate processing system according to a second embodiment.
Figure 12:
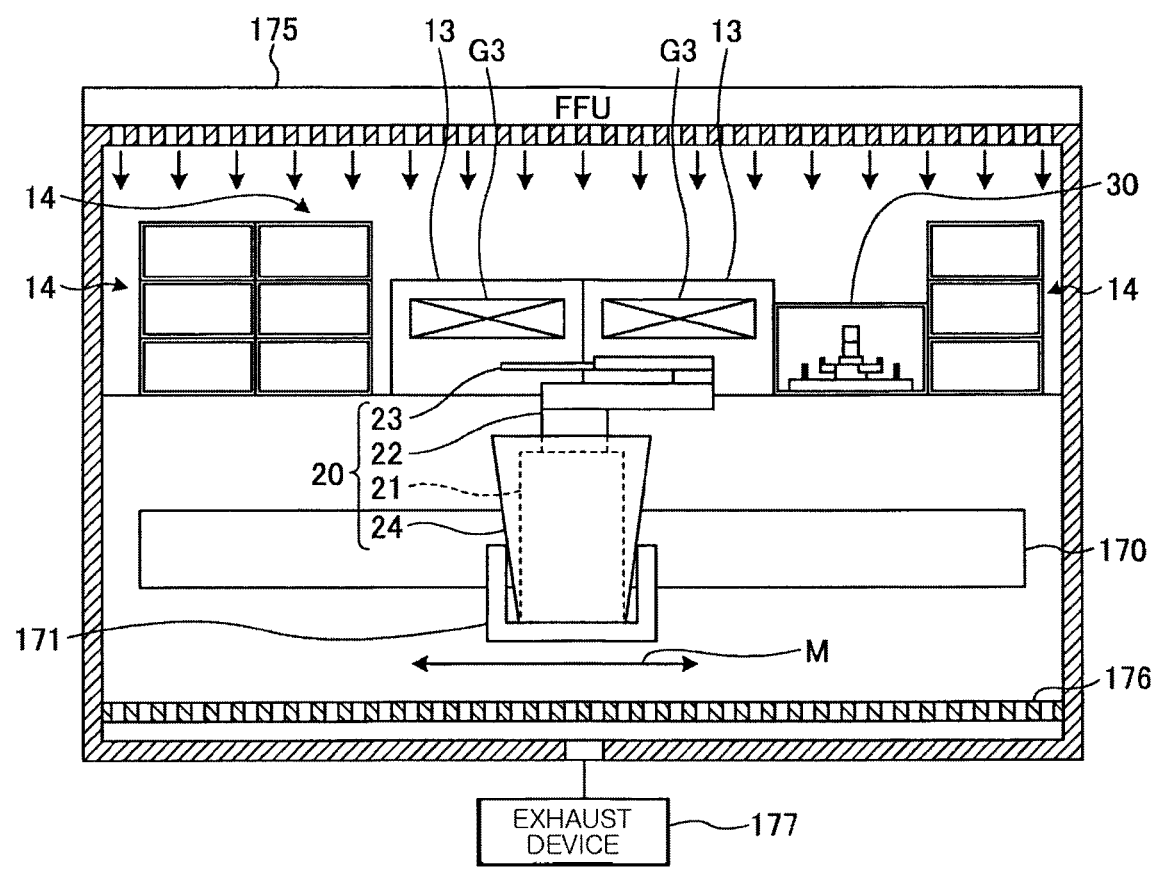
FIG. 12 shows an example of a cross-sectional view of the substrate processing system taken along a dashed dotted line XII-XII in FIG. 11.

FIG. 11 is a plan view showing an example of a configuration of the substrate processing system 1 according to a second embodiment. FIG. 12 shows an example of a cross-sectional view of the substrate processing system 1 taken along a dashed dotted line XII-XII in FIG. 11. In FIG. 11, some internal components of devices are illustrated transparently for easier understanding. The vacuum transfer module 11 includes a main body 10 and a control device 100 that controls the main body 10. Except for the difference described below, in FIG. 11, the components having the same reference numerals as those in FIG. 1 have the same or similar functions as the components illustrated in FIG. 1, and thus the description thereof will be omitted.

The main body 10 includes a vacuum transfer module 11, a plurality of substrate processing modules 12, a plurality of load lock modules 13, a plurality of storage modules 14, an atmospheric transfer module 17, a plurality of load ports 18, and an aligner module 30.

In the present embodiment, the plurality of storage modules 14 are disposed adjacent to (on the lateral side of) one load lock module 13. Further, the aligner module 30 is disposed between the other load lock module 13 and the other storage module 14.

The aligner module 30 is configured to adjust the orientation of the substrate W transferred into the aligner module 30. The orientation-adjusted substrate W is transferred from the aligner module 30 by the transfer robot 20 into the load lock module 13 through the gate valve G3. Further, the aligner module 30 is further configured to adjust the orientation of the ER transferred into the aligner module 30. The orientation-adjusted ER is transferred from the aligner module 30 by the transfer robot 20 into the load lock module 13 through the gate valve G3.

(Structure of the Aligner Module 30)

Figure 13:
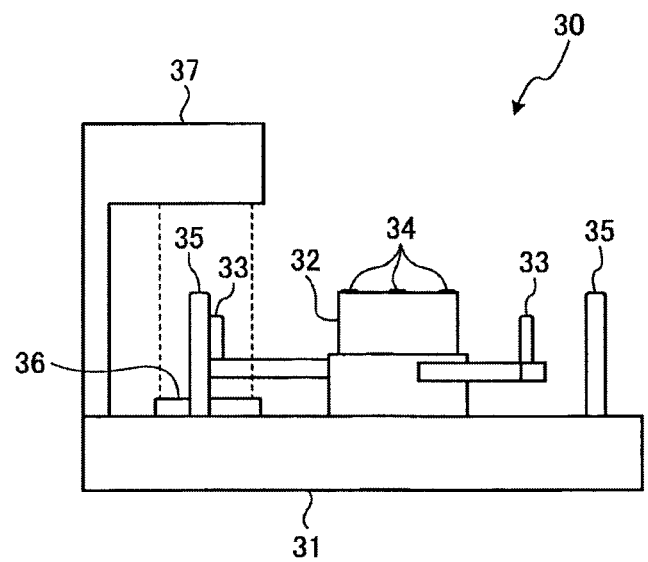
FIG. 13 is a side view showing an example of an aligner module.
Figure 14:
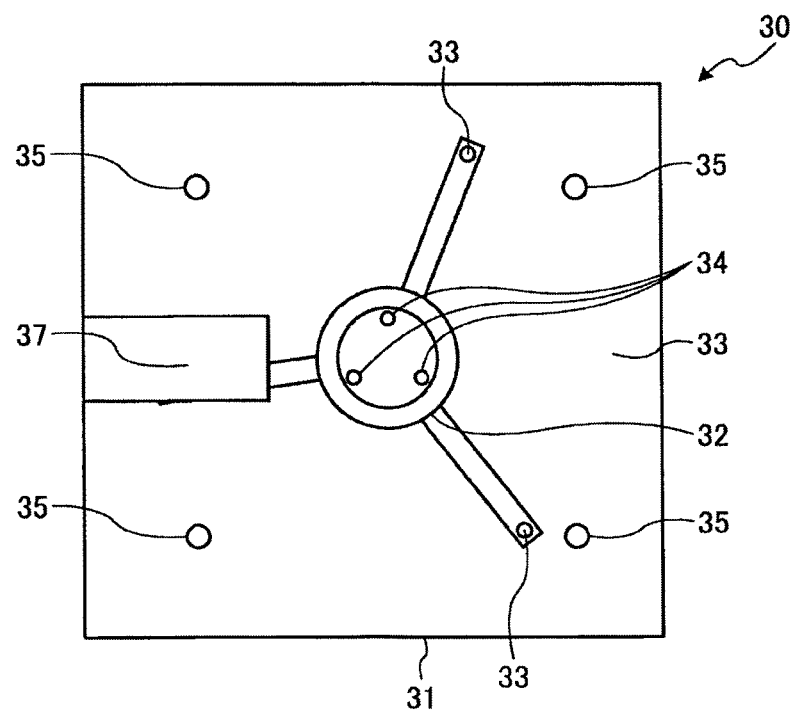
FIG. 14 is a plan view showing an example of the aligner module.

FIG. 13 is a side view showing an example of the aligner module 30, and FIG. 14 is a plan view showing an example of the aligner module 30. The aligner module 30 includes a mounting base 31, a rotor 32, a plurality of ER support pads 33, a plurality of substrate support pads 34, a plurality of lift pins 35, a light emitting unit 36, and a light receiving unit 37. The ER support pad 33 is an example of the ER support, and the substrate support pad 34 is an example of the substrate support. The light receiving unit 37 is an example of a determiner.

The rotor 32 is provided on the mounting base 31. The plurality of ER support pads 33 and the plurality of substrate support pads 34 are provided on the rotor 32. The rotor 32 is rotated by a drive mechanism (not shown) provided in the mounting base 31. As the rotor 32 is rotated, the plurality of ER support pads 33 and the plurality of substrate support pads 34 are also rotated. The plurality of lift pins 35 is raised and lowered by a drive mechanism (not shown) provided in the mounting base 31. The rotor 32, each ER support pad 33, and each lift pin 35 are provided at positions that do not interfere with the end effector 23 when the end effector 23 on which the substrate W or the ER is placed is introduced into the aligner module 30.

The light emitting unit 36 is a light source that irradiates light toward the light receiving unit 37. The light emitting unit 36 may be, for example, a light emitting diode (LED) or a semiconductor laser. The light receiving unit 37 detects the amount of light emitted from the light emitting unit 36 and outputs the detected amount of light to the control device 100. The light receiving unit 37 may be, for example, a line sensor such as a charge coupled device (CCD) or a complementary metal oxide semiconductor (CMOS).

(Procedure for Correcting the Positional Misalignment of the ER)

Hereinafter, the procedure when the positional misalignment of the ER is corrected in the aligner module 30 will be described with reference to FIGS. 15 to 18.

Figure 15:
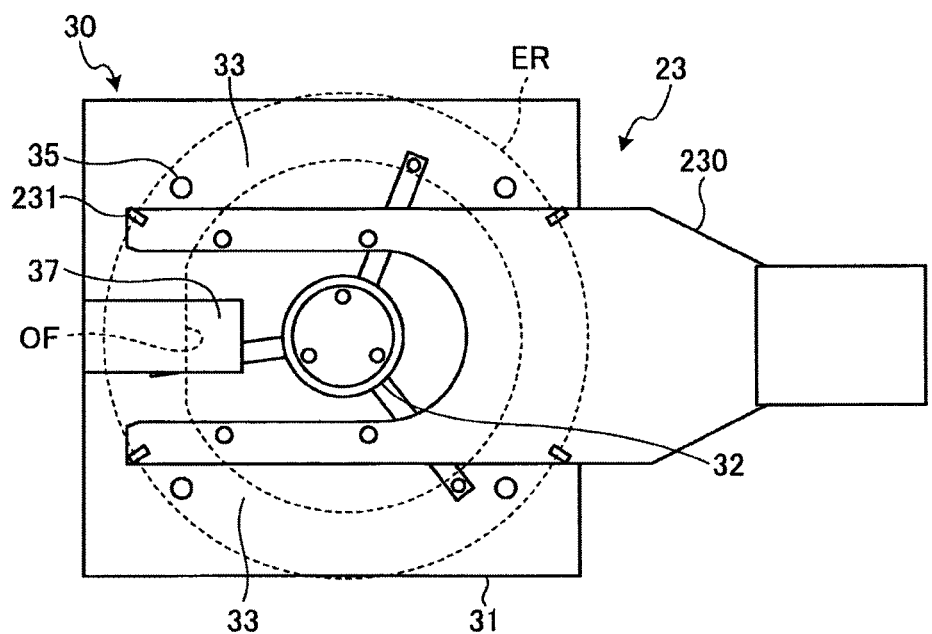
FIG. 15 is a plan view showing an example of a positional relationship between the aligner module, the ER, and the end effector when the ER is transferred into the aligner module.

First, for example, as shown in FIG. 15, the end effector 23 on which the ER is placed is introduced into the aligner module 30 in a state where the lift pins 35 are raised. The ER has an oriental flat (OF) that is a shape that serves as a reference for the position of the ER.

Figure 16:
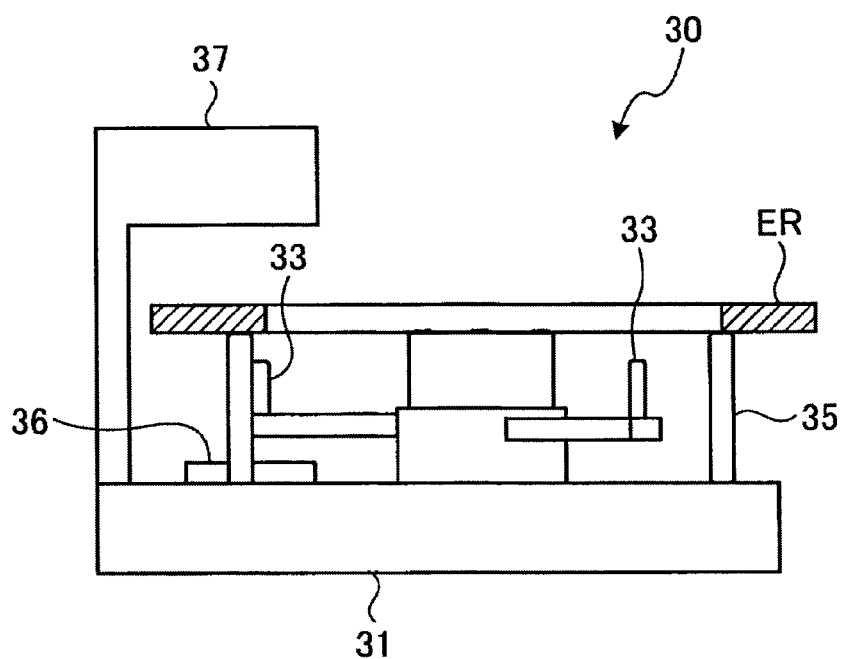
FIG. 16 is a side view showing an example of a positional relationship between the aligner module and the ER when the ER is placed on the lift pins.

Next, when the end effector 23 is lowered, the ER placed on the end effector 23 is placed on the lift pins 35, for example, as shown in FIG. 16. Then, the end effector 23 is retracted to the outside of the aligner module 30.

Figure 17:
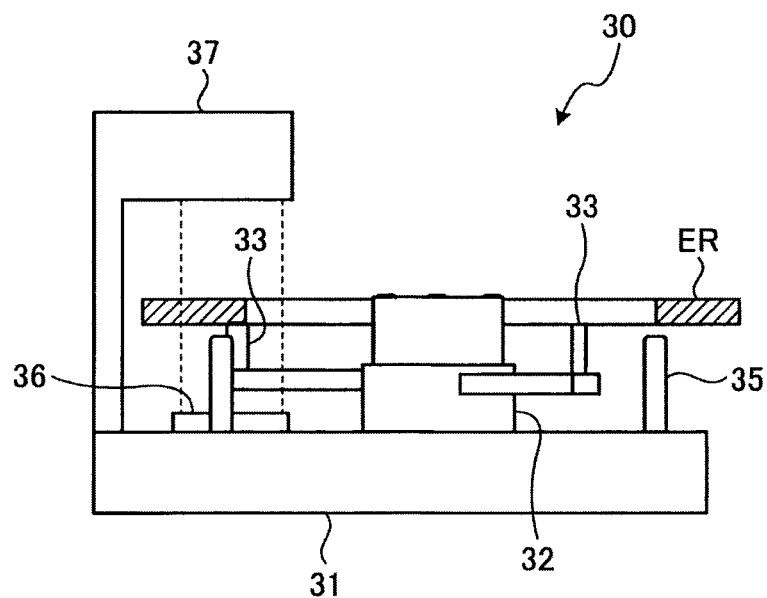
FIG. 17 is a side view showing an example of a positional relationship between the aligner module and the ER when the ER is placed on the ER support pads.

Then, when the lift pins 35 are lowered, the ER is placed on the ER support pads 33, for example, as shown in FIG. 17. Then, the rotor 32 is rotated to rotate the ER placed on the ER support pads 33. Then, the light emitting unit 36 irradiates the light toward the light receiving unit 37, and the amount of light detected by the light receiving unit 37 is output to the control device 100.

Figure 18:
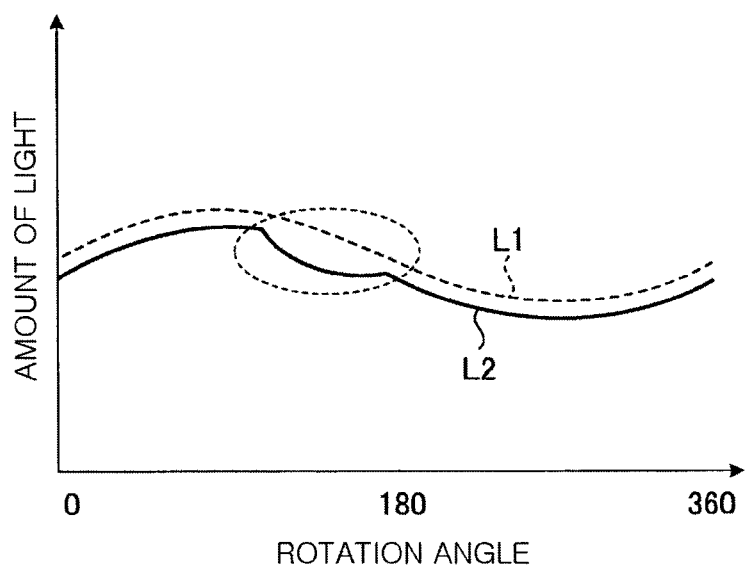
FIG. 18 shows an example of a change in an amount of light received with rotation of the ER.

Here, in a case where the ER does not have the OF, if the rotation axis of the rotor 32 and the rotation axis of the ER are misaligned, the amount of light detected by the light receiving unit 37 as the ER rotates varies as shown by a curve L1 of FIG. 18, for example. The variable amplitude of the curve L1 depends on the magnitude of the misalignment between the rotation axis of the rotor 32 and the rotation axis of the ER.

In a case where the ER has the OF, the amount of light actually detected by the light receiving unit 37 varies as shown by a curve L2 of FIG. 18, for example. In the curve L2, a portion surrounded by a broken line indicates a change in the amount of light when the OF passes between the light emitting unit 36 and the light receiving unit 37. The control device 100 determines the direction and magnitude of the misalignment of the ER based on the variable amplitude of the amount of light and the rotation angle of the ER when the OF passes between the light emitting unit 36 and the light receiving unit 37.

Next, when the lift pins 35 are raised, the ER is placed on the lift pins 35. Then, the control device 100 controls the transfer robot 20 so that the end effector 23 is introduced and positioned at a position corresponding to the determined direction and magnitude of the misalignment of the ER. Then, when the end effector 23 is raised, the ER is placed on the end effector 23. Thus, the positional misalignment of the ER can be corrected.

(Procedure for Correcting the Positional Misalignment of the Substrate W)

Hereinafter, the procedure when the positional misalignment of the substrate W is corrected in the aligner module 30 will be described with reference to FIGS. 19 to 21.

Figure 19:
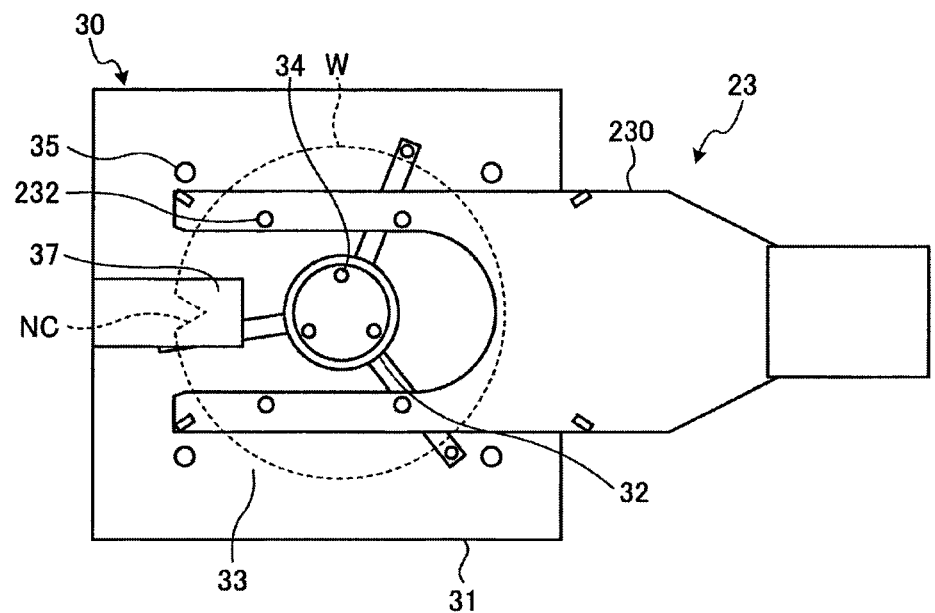
FIG. 19 is a plan view showing an example of a positional relationship between the aligner module, the substrate, and the end effector when the substrate is transferred into the aligner module.

First, for example, as shown in FIG. 19, the end effector 23 on which the substrate W is placed is introduced into the aligner module 30 in a state where the lift pins 35 are lowered. The substrate W has a notch (NC) that is a shape that serves as a reference for the position of the substrate W.

Figure 20:
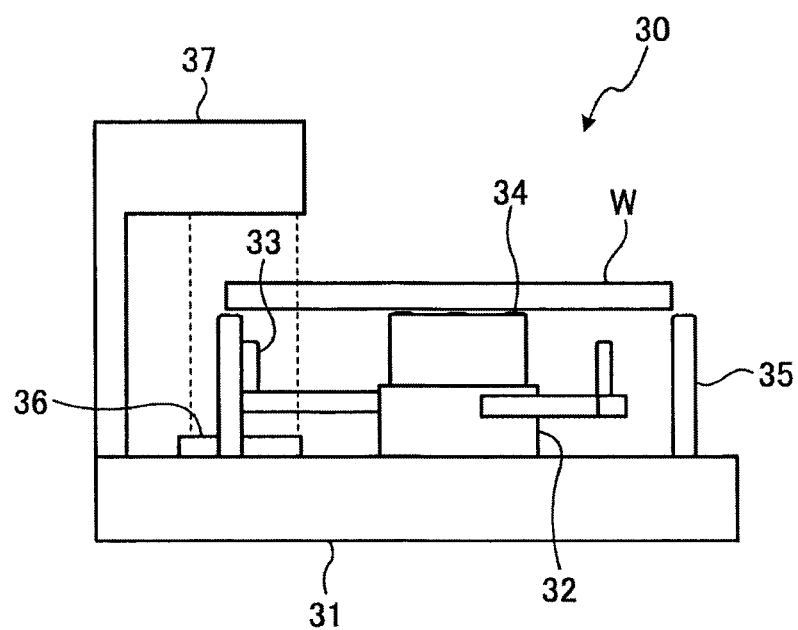
FIG. 20 is a side view showing an example of a positional relationship between the aligner module and the substrate when the substrate is placed on the substrate support pads.

Next, when the end effector 23 is lowered, the substrate W placed on the end effector 23 is placed on the substrate support pads 34, for example, as shown in FIG. 20. Then, the end effector 23 is retracted to the outside of the aligner module 30.

Next, the rotor 32 is rotated to rotate the substrate W placed on the substrate support pads 34. Then, the light emitting unit 36 irradiates the light toward the light receiving unit 37, and the amount of light detected by the light receiving unit 37 is output to the control device 100.

Figure 21:
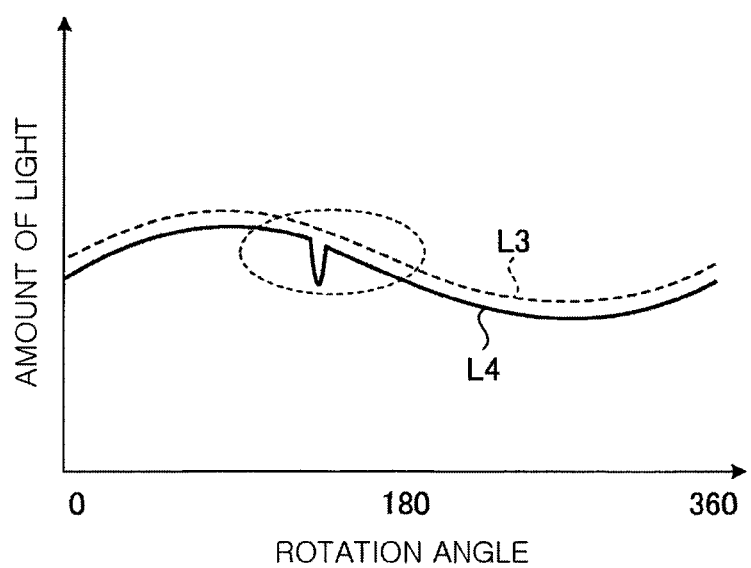
FIG. 21 shows an example of a change in an amount of light received with rotation of the substrate.

Here, in a case where the substrate W does not have the NC, if the rotation axis of the rotor 32 and the rotation axis of the substrate W are misaligned, the amount of light detected by the light receiving unit 37 as the substrate W rotates varies as shown by a curve L3 of FIG. 21, for example. The variable amplitude of the curve L3 depends on the magnitude of the misalignment between the rotation axis of the rotor 32 and the rotation axis of the substrate W.

In a case where the substrate W has the NC, the amount of light actually detected by the light receiving unit 37 varies as shown in a curve L4 of FIG. 21, for example. In the curve L4, a portion surrounded by a broken line indicates a change in the amount of light when the NC passes between the light emitting unit 36 and the light receiving unit 37. The control device 100 determines the direction and magnitude of the misalignment of the substrate W based on the variable amplitude of the amount of light and the rotation angle of the substrate W when the NC passes between the light emitting unit 36 and the light receiving unit 37.

Next, the control device 100 controls the transfer robot 20 so that the end effector 23 is introduced and positioned at a position corresponding to the determined direction and magnitude of the misalignment of the substrate W. Then, when the end effector 23 is raised, the substrate W is placed on the end effector 23. Thus, the positional misalignment of the substrate W can be corrected.

The second embodiment has been described above. As described above, the substrate processing system 1 of the present embodiment includes an aligner module 30 connected to the first sidewall 172 of the atmospheric transfer module 17 adjacent to the load lock module 13. The aligner module 30 has a function of correcting the positional misalignment of the substrate W and a function of correcting the positional misalignment of the ER. The transfer arm 22 can further transfers the ER. As a result, the installation area of the substrate processing system 1 can be further reduced.

Further, in the second embodiment described above, the aligner module 30 has the rotor 32, the ER support pads 33, the substrate support pads 34, the lift pins 35, and the light receiving unit 37. The lift pins 35 receive the ER from the transfer arm 22 that serves as the substrate transfer arm. In other words, the transfer arm 22 serving as the substrate transfer arm transfers the ER from the atmospheric transfer module 17 to the aligner module 30, and places the ER, which is placed on the transfer arm 22, on the lift pins 35. The ER support pads 33 receive the ER from the lift pins 35 to support the ER. The substrate support pads 34 receive the substrate W from the transfer arm 22. In other words, the transfer arm 22 serving as the substrate transfer arm transfers the substrate W from the atmospheric transfer module 17 to the aligner module 30, and places the substrate W, which is placed on the transfer arm 22, on the substrate support pads 34. The rotor 32 rotates the ER support pads 33 and the substrate support pads 34. Accordingly, the ER on the ER support pads 3 and the substrate W on the substrate support pads 34 are rotated. The light receiving unit 37 detects a reference shape (notch) of the substrate W on the substrate support pads 34 while the substrate support pads 34 are rotated by the rotor 32. Further, the light receiving unit 37 detects a reference shape (oriental flat) of the ER on the ER support pads 33 while the ER support pads 33 are rotated by the rotor 32. Thus, the positional misalignment of the substrate W and the positional misalignment of the ER can be corrected.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

The invention claimed is:

1. A transfer system comprising:
   an atmospheric transfer module having a front face and a rear face opposite to the front face;
   a substrate transfer robot configured to simultaneously or separately transfer a substrate and an edge ring in the atmospheric transfer module;
   a load lock module having a front face and a rear face opposite to the front face, the front face of the load lock module being connected to the rear face of the atmospheric transfer module;
   a vacuum transfer module having a front face, a rear face opposite to the front face, and a lateral face between the front face and the rear face, the front face of the vacuum transfer module being connected to the rear face of the load lock module;
   a substrate processing module connected to the lateral face of the vacuum transfer module; and
   an aligner module disposed between the atmospheric transfer module and the substrate processing module, the aligner module having a front face and a rear face opposite to the front face, the front face of the aligner module being connected to the rear face of the atmospheric transfer module, the rear face of the aligner module facing the substrate processing module, the aligner module being configured to correct misalignment of the substrate and misalignment of the edge ring.

2. The transfer system of claim 1, wherein the aligner module includes:
   a rotating unit having a ring support;
   a driving unit configured to rotate the rotating unit; and
   a detector configured to detect a reference shape of the edge ring during which the edge ring on the ring support is rotated by rotation of the rotating unit.

3. The transfer system of claim 2, wherein
   the rotating unit further has a substrate support, and
   the detector is further configured to detect a reference shape of the substrate during which the substrate on the substrate support is rotated by rotation of the rotating unit.

4. The transfer system of claim 3, wherein
   the reference shape of the edge ring is an oriental flat, and
   the reference shape of the substrate is a notch.

5. The transfer system of claim 4, wherein the detector includes:
   a light emitting unit configured to radiate a light in a vertical direction, and a light receiving unit disposed above or below the light emitting unit and configured to receive the light from the light emitting unit.

6. The transfer system of claim 5, further comprising a controller configured to determine a direction and a magnitude of the misalignment of the edge ring based on an amplitude of the received light and a rotation angle of the edge ring.

7. The transfer system of claim 6, wherein the controller is further configured to determine a direction and a magnitude of the misalignment of the substrate based on an amplitude of the received light and a rotation angle of the substrate.

8. The transfer system of claim 1, wherein the aligner module is disposed adjacent to the load lock module.

9. The transfer system of claim 1, further comprising a guide rail fixed to a sidewall of the atmospheric transfer module, wherein
the substrate transfer robot is movable along the guide rail.

* * * * *